United States Patent [19]

Arakawa et al.

[11] Patent Number: 5,572,051

[45] Date of Patent: Nov. 5, 1996

[54] SOLID STATE IMAGE SENSING DEVICE

[75] Inventors: Kenichi Arakawa, Yokohama; Kenji Nakahara, Kawasaki, both of Japan

[73] Assignee: Kabushiki Kaisha Toshiba, Kanagawa-ken, Japan

[21] Appl. No.: 351,013

[22] Filed: Dec. 7, 1994

[30]     Foreign Application Priority Data

Dec. 9, 1993   [JP]  Japan .................................. 5-309056

[51] Int. Cl.$^6$ ................................................. H01L 27/148
[52] U.S. Cl. ........................... 257/225; 257/223; 257/229
[58] Field of Search ..................................... 257/225, 229, 257/223, 392, 402, 655

[56]               References Cited

U.S. PATENT DOCUMENTS

| 3,896,485 | 7/1975 | Early ........................................... 357/24 |
| 5,469,484 | 11/1995 | Sato et al. .................................. 257/223 |

FOREIGN PATENT DOCUMENTS

| 0517164A1 | 12/1992 | European Pat. Off. ...... H01L 29/796 |
| 0573292A1 | 12/1993 | European Pat. Off. ...... H01L 27/148 |

OTHER PUBLICATIONS

Abstract–Hirama Masahide, "CCD Image Sensor", vol. 17, No. 378, JP910222923, Mar. 12, 1993, pp. 465–470.

*Primary Examiner*—Mark V. Prenty
*Attorney, Agent, or Firm*—Finnegan, Henderson, Farabow, Garrett & Dunner, L.L.P.

[57]               ABSTRACT

A solid state image sensing device, comprises: an n-type semiconductor substrate (11), a p-type well (12) formed on a surface of the semiconductor substrate, and a $p^+$-type diffusion layer (13, 21) having an impurity concentration higher than that of the well. In particular, the $P^+$-type diffusion layer (13) is formed so as to cover at least a part of circumference of an n-type diffusion layer (17) of a load transistor (N3) formed in the well (12) as a source follower circuit. Instead, the $P^+$-type diffusion layer (21) is formed between the n-type diffusion layer (17) of the load transistor (N3) and the semiconductor substrate (11). In both the cases, since the n-type diffusion layer (17) of the load transistor (N3) of the source follower circuit is covered with the second conductivity diffusion layer (13, 21) higher in impurity concentration than that of the well, even when a pulse is applied to the semiconductor substrate during electronic shutter operation, the p-type well (12) is not depleted, so that it is possible to prevent punch through current (I) from flowing from the n-type diffusion layer (17) of the load transistor (N3) to the n-type substrate (11).

6 Claims, 2 Drawing Sheets

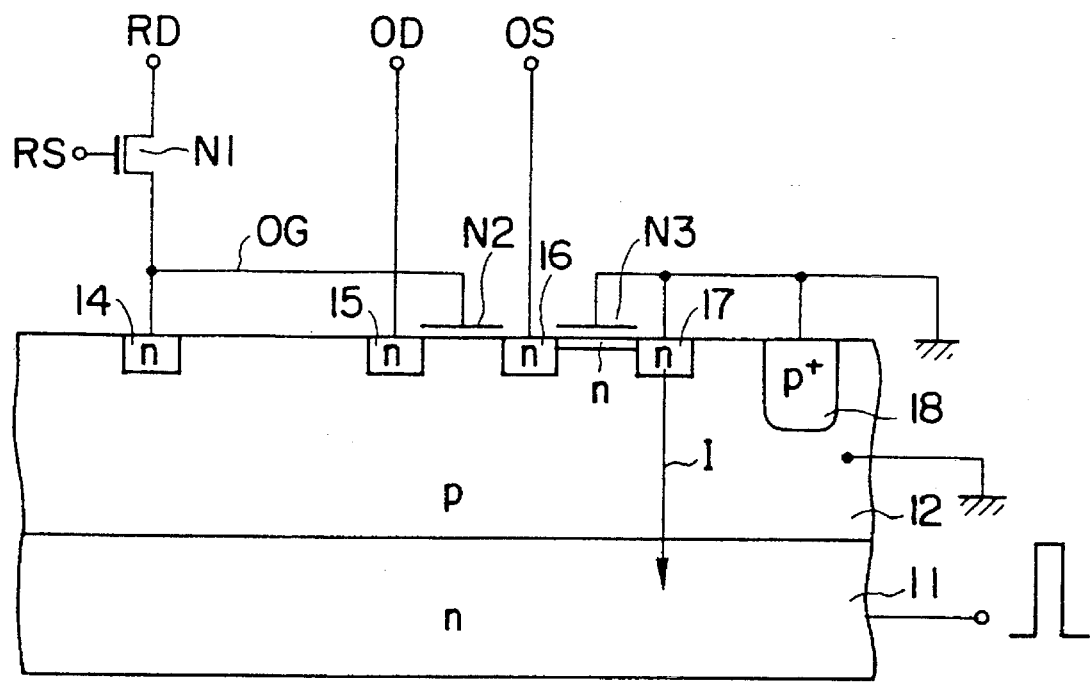
F I G. 1

SOLID STATE IMAGE SENSING DEVICE

BACKGROUND OF THE INVENTION

The present invention relates to a solid state image sensing device.

When a picture moving at a high speed is sensed by a solid state image sensing device, the solid state image sensing device is activated by an electronic shutter operation. In this electronic shutter operation, a pulse is applied to the semiconductor substrate to extract signal charges accumulated at respective pixel portions to the semiconductor substrate side. In this case, however, where the pixel dimensions decrease with the advance of microminiaturization, since the relative change in the overflow channel potential at the pixel portion becomes small relative to the potential change of the semiconductor substrate, it has become difficult to extract the signal charges from the pixel portions to the substrate side. To improve this problem, it has been necessary to increase the impurity concentration of the semiconductor substrate.

When the impurity concentration of the semiconductor substrate increases, however, a difference in impurity concentration between the semiconductor substrate and wells formed on the surface of the semiconductor substrate becomes small, with the result that when a pulse is applied to the semiconductor substrate, a punch through phenomenon is inevitably generated in a source follower circuit of the output section of the image sensing device. This punch through phenomenon is explained with reference to the attached drawing.

FIG. 1 shows a structure of an output section in a solid state image sensing device related to the present invention. In the drawing, a p-type well 12 is formed in the surface of an n-type semiconductor substrate 11, and the output section is formed in this p-type well 12. Further, the p-type well 12 is connected to the ground.

Further, on the surface portion of the p-type well 12, an N-channel MOS transistor N2 having n-type diffusion layers 15 and 16 formed as drain and source regions thereof is formed. This N-channel MOS transistor N2 is used as a transistor for outputting a signal charge. Further, the gate OG of this N-channel transistor N2 is connected to an n-type diffusion layer 14 and a source of a resetting N-channel transistor N1.

Between the n-type diffusion layer 16 (which corresponds to the source region of the outputting N-channel transistor N2) and the ground potential terminal 17, an N-channel transistor N3 used as a load transistor is formed.

This N-channel transistor N3 is of depletion type, in which n-type impurities are implanted in a channel region thereof. The N-channel transistor N3 has an n-type diffusion layer 16 as a drain and an n-type diffusion layer 17 as a source. Further, a ground potential terminal and a $p^+$-type diffusion layer 18 are connected to the n-type diffusion layer 17 of the source region of this N-channel transistor N3.

In the output section formed as described above, when the impurity concentration of the n-type semiconductor substrate 11 is increased to extract the signal charge, the difference in impurity concentration between the substrate 11 and the p-type well 12 becomes small. Accordingly, when a pulse is applied to the n-type semiconductor substrate 11 during the electronic shutter operation, the p-type well 12 is depleted, so that a punch through current I flows from the n-type diffusion layer (the grounded source) 17 of the load N-channel transistor N3 to the n-type semiconductor substrate 11. As a result, since the potential of the n-type diffusion layer 17 rises beyond the ground potential, the S/N ratio of the signal outputted by the output N-channel transistor N2 deteriorates.

SUMMARY OF THE INVENTION

Accordingly, the object of the present invention is to provide a solid state image sensing device which can prevent the punch through from being generated during the electronic shutter operation and further improve the S/N ratio of the output signal, even if the pixel dimensions are reduced with the advance of the microminiaturization of the image sensing device.

To achieve the above-mentioned object, the present invention provide a solid state image sensing device, comprising: a first conductive type semiconductor substrate; a second conductive type well formed on a surface of the semiconductor substrate, the first and second conductivity types being opposite to each other; and a second conductive type diffusion layer having an impurity concentration higher than that of the well, the second conductive type diffusion layer being so formed as to cover at least a part of circumference of a first conductive type diffusion layer of a load transistor formed in the well as a source follower circuit.

In the solid state image sensing device according to the present invention, since at least part of the circumference of the first conductivity type diffusion layer of a load transistor formed as a source follower circuit is converted with the second conductivity type diffusion layer having an impurity concentration higher than that of the well, even if a pulse is applied to the semiconductor substrate during the electronic shutter operation, it is possible to prevent the second conductivity type diffusion layer from being depleted, so that the generation of the punch through between the first conductivity type diffusion layer and the semiconductor substrate can be prevented, thus improving the S/N ratio of the output signal.

Further, even if the second conductive type diffusion layer having an impurity concentration higher than that of the well is formed between the first conductivity type diffusion layer of the load transistor formed in the well as a source follower circuit and the semiconductor substrate, the same effect can be obtained.

BRIEF DESCRIPTION OF THE DRAWINGS

In the attached drawings:

FIG. 1 is a longitudinal cross-sectional view showing the solid state image sensing device related to the present invention;

DETAILED DESCRIPTION OF THE EMBODIMENTS

Figure 2:
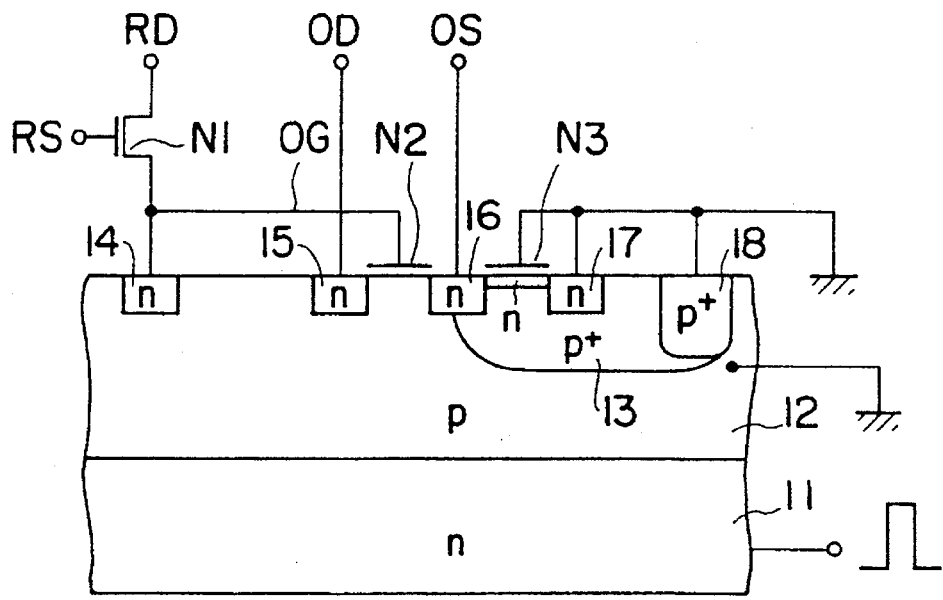
FIG. 2 is a longitudinal cross-sectional view showing a first embodiment of the solid state image sensing device according to the present invention.

Embodiments of the present invention will be described hereinbelow with reference to the attached drawings:

FIG. 2 shows a longitudinal cross-sectional structure of the output section of a first embodiment of the solid state image sensing device according to the present invention. The structure shown in FIG. 2 is substantially the same as that shown in FIG. 1, except a $p^+$-type diffusion layer 13. That is, the feature of this embodiment is that the $p^+$-type diffusion layer 13 is formed so as to cover at least a part of the circumference of the n-type diffusion layer 17 of the load N-channel transistor N3 formed as a source follower circuit of the output section. The impurity concentration of this $p^+$-type diffusion layer 13 is set to $1\times10^{16}$ cm$^{-3}$, for instance. Further, the impurity concentration of the $p^+$-type well 12 is set to $1\times10^{15}$ cm$^{-3}$, and the $p^+$-type diffusion layer 18 is set to $1\times10^{17}$ cm$^{-3}$. Further, the impurity concentration of the n-type semiconductor substrate 11 is set to $5\times10^{14}$ cm$^{-3}$, for instance.

As described above, in the image sensing device shown in FIG. 1, since the impurity concentration of the n-type semiconductor substrate 11 is set high so as to cope with the electronic shutter operation, a punch through current is inevitably generated between the n-type diffusion layer (grounded source) 17 of the load transistor N3 is and the n-type semiconductor substrate 11.

In this first embodiment shown in FIG. 2, however, the $p^+$-type diffusion layer 13 (whose impurity concentration is higher than that of the p-type well 12) is so formed as to cover at least a part of the circumference of the n-type diffusion layer 17. Therefore, even if a high level pulse is applied to the n-type semiconductor substrate 11, the $p^+$-type diffusion layer 13 is not depleted. As a result, it is possible to prevent a punch through current from flowing from the n-type diffusion layer 17 to the n-type semiconductor substrate 11, with the result that the S/N ratio of the output signal can be improved.

Figure 3:
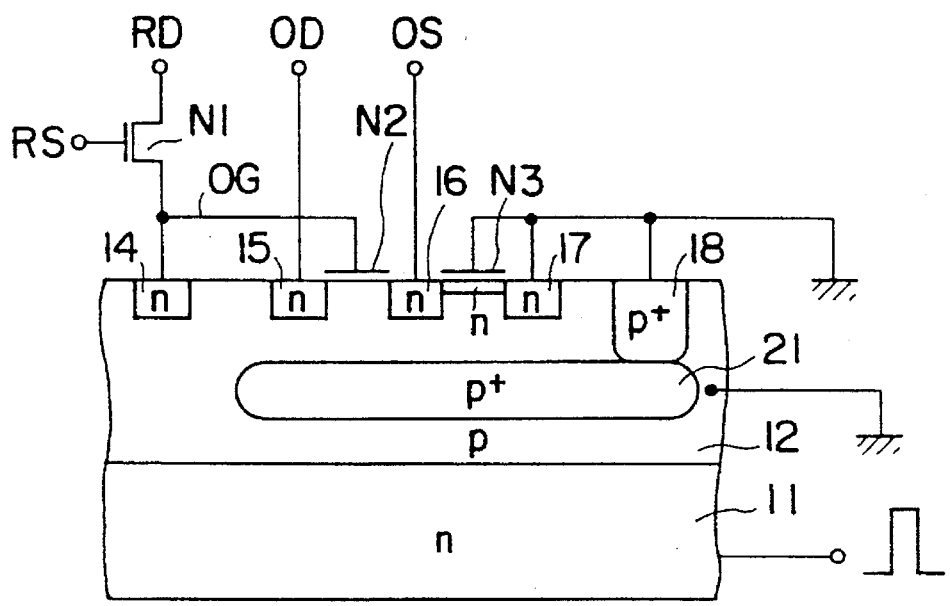
FIG. 3 is a longitudinal cross-sectional view showing a second embodiment of the solid state image sensing device according to the present invention.

FIG. 3 shows a second embodiment of the solid state image sensing device according to the present invention. In this second embodiment, the $p^+$-type diffusion layer 21 is formed at a position different from that of the first embodiment shown in FIG. 2. In the case of the first embodiment, the $p^+$-type diffusion layer 13 is formed so as to cover the grounded n-type diffusion layer (source) 17 of the N-channel transistor N3 used as a load. In this second embodiment, the $p^+$-type diffusion layer 21 is formed locally between the n-type diffusion layer 17 and the n-type semiconductor substrate 11. This $p^+$-type diffusion layer 21 can be formed by implanting impurity ions locally under application of high acceleration voltage. Here, the impurity concentration of the $p^+$-type diffusion layer 21 is set to $1\times10^{16}$ cm$^{-3}$, for instance in the same way as with the case of the first embodiment.

In this second embodiment, it is also possible to prevent the punch through current from flowing from the n-type diffusion layer 17 to the n-type semiconductor substrate 11 owing to the presence of the $p^+$-type diffusion layer 21, in the same way as in the first embodiment. Further, in the first embodiment, since the n-type diffusion layer 17 and the channel region of the N-channel transistor N3 are covered with the $p^+$-type diffusion layer 13 of high impurity concentration, it is necessary to set the impurity concentration of the n-type channel region higher than that of the conventional one, in order to prevent the threshold voltage of the N-channel transistor N3 from fluctuating. In this second embodiment, however, since the n-type diffusion layer 17 and the channel region of the N-channel transistor N3 are covered by the p-type well 12 in the same way as with the case of the conventional one, it is possible to prevent the threshold voltage of the N-channel transistor N3 from fluctuating by the presence of the $p^+$-type diffusion layer 21.

The above-mentioned embodiments have been explained only by way of example. Therefore, the present invention is not limited to only the above-mentioned embodiments. For instance, the present invention can be applied to the device in which the conductivities of the elements shown are all inverted. Further, in the above-mentioned embodiments, the $p^+$-type diffusion layers 13 and 21 are formed around or under the grounded n-type diffusion layer 17 of the source follower circuit formed as the output section. However, it is not necessary to ground this diffusion layer 17, as far as a voltage lower than the supply voltage is applied thereto. Further, it is also possible to form a high concentration layer of the same conductivity type as that of the well 12, around and under a diffusion layer 18 formed as a diode for protecting circuit.

Further, in the embodiments, the impurity concentration of the p-type well 12 is set to $1\times10^{15}$ cm$^{-3}$, and the impurity concentration of the $p^+$-type diffusion layer 13 is set to $1\times10^{16}$ cm$^{-3}$. However, these impurity concentrations are not of course limited only to these values.

What is claimed is:

1. A solid state image sensing device, comprising:

a first conductive type semiconductor substrate;

a second conductive type well formed on a surface portion of said semiconductor substrate, the first and second conductivity types being opposite to each other;

a first conductive type diffusion layer of a load transistor of a source follower circuit formed in said well; and a second conductive type diffusion layer having an impurity concentration higher than that of said well and being formed in said well under and detached from said first conductive type diffusion layer.

2. A solid state image sensing device, comprising:

an output section formed on a surface portion of a second conductivity type well formed on a surface portion of a first conductivity type semiconductor substrate, the first and second conductivity types being opposite to each other, said output section having:

a first MOS transistor having a first diffusion layer of first conductivity type and a second diffusion layer of first conductivity type, and formed as an output transistor for outputting a signal charge to the outside;

a second MOS transistor having the second diffusion layer and a third diffusion layer of first conductivity type, and formed between one terminal of the output transistor and a ground voltage terminal as a load transistor; and a fourth diffusion layer of the second conductivity type having an impurity concentration higher than that of said well and being formed in said well under and detached from said third diffusion layer.

3. The solid state image sensing device of claim 2, wherein a fifth diffusion layer of the second conductive type is further formed on the surface portion of said well and is connected to said third and fourth diffusion layers and the ground voltage terminal.

4. The solid state image sensing device of claim 2, wherein the second MOS transistor is of depletion type having a channel region to which first conductivity type impurities are doped.

5. The solid state image sensing device of claim 2, wherein:

a gate electrode of the first MOS transistor is connected to a first conductivity type resetting diffusion layer formed on the surface portion of the well;

both ends of the resetting transistor are connected between the resetting diffusion layer and a reset terminal; and when the resetting transistor is turned on, conduction between the resetting diffusion layer and the first diffusion layer of the first MOS transistor is turned on.

6. The solid state image sensing device of claim 2, wherein impurity concentration of the second conductivity type well is set to $1 \times 10^{15}$ cm$^{-3}$ or more, and impurity concentration of the second conductivity diffusion layer is set to $1 \times 10^{16}$ cm$^{-3}$ or more.

* * * * *